(12) United States Patent
Butler (10) Patent No.: US 9,261,799 B2
(45) Date of Patent: Feb. 16, 2016

(54) MOVABLE SUPPORT, POSITION CONTROL SYSTEM, LITHOGRAPHIC APPARATUS AND METHOD OF CONTROLLING A POSITION OF AN EXCHANGEABLE OBJECT

(75) Inventor: Hans Butler, Best (NL)

(73) Assignee: ASML NETHERLANDS B.V., Veldhoven (NL)

( * ) Notice: Subject to any disclaimer, the term of this patent is extended or adjusted under 35 U.S.C. 154(b) by 795 days.

(21) Appl. No.: 12/366,827

(22) Filed: Feb. 6, 2009

(65) Prior Publication Data

US 2009/0201477 A1    Aug. 13, 2009

Related U.S. Application Data

(60) Provisional application No. 61/064,051, filed on Feb. 13, 2008.

(51) Int. Cl.
*G03F 7/20*    (2006.01)

(52) U.S. Cl.
CPC ............ *G03F 7/70758* (2013.01); *G03F 7/707* (2013.01); *G03F 7/70725* (2013.01); *G03F 7/70775* (2013.01)

(58) Field of Classification Search
CPC . G03F 7/707; G03F 7/70725; G03F 7/70758; G03F 7/70775
USPC ......... 355/52, 53, 55, 72, 75, 77; 250/442.11, 250/492.2, 548; 378/34, 35; 310/10, 12
See application file for complete search history.

(56) References Cited

U.S. PATENT DOCUMENTS

| 5,900,707 | A  | * | 5/1999 | Wakui .................. G03F 7/70358 318/560 |
| 6,373,072 | B1 | * | 4/2002 | Butler et al. ............. 250/492.24 |
| 6,490,025 | B1 |   | 12/2002 | Makinouchi et al. |
| 6,937,319 | B2 |   | 8/2005 | Nishi |
| 7,474,496 | B1 | * | 1/2009 | Sun et al. .................... 360/78.05 |
| 2001/0055117 | A1 |  | 12/2001 | Mizutani |
| 2002/0113726 | A1 | * | 8/2002 | Nagaraj ......................... 341/156 |
| 2004/0055576 | A1 | * | 3/2004 | McCarthy, Jr. ............... 123/458 |

(Continued)

FOREIGN PATENT DOCUMENTS

| JP | 59-072135 A | 4/1984 |
| JP | 09-306829 A | 11/1997 |

(Continued)

OTHER PUBLICATIONS

Office Action in related Japanese application No. 2009-024480 mailed Jun. 2, 2011.

*Primary Examiner* — Toan Ton
*Assistant Examiner* — Mona M Sanei
(74) *Attorney, Agent, or Firm* — Pillsbury Winthrop Shaw Pittman LLP (57) ABSTRACT

A movable support is configured to hold an exchangeable object. The support includes a movable structure movably arranged with respect to a reference object, an object holder movably arranged with respect to the movable structure and configured to hold the exchangeable object, an actuator configured to move the movable structure with respect to the reference object, and an ultra short stroke actuator configured to move the object holder with respect to the movable structure, wherein a stiffness of the ultra short stroke actuator is substantially larger than a stiffness of the at least one actuator.

30 Claims, 4 Drawing Sheets

(56) References Cited

U.S. PATENT DOCUMENTS

| | | | |
|---|---|---|---|
| 2005/0041233 A1* | 2/2005 | Van Schothorst et al. | 355/72 |
| 2005/0185319 A1* | 8/2005 | Liu et al. | 360/77.04 |
| 2005/0200208 A1* | 9/2005 | Johan Hol et al. | 310/12 |
| 2005/0219499 A1* | 10/2005 | Maria Zaal et al. | 355/72 |
| 2006/0077364 A1* | 4/2006 | Cox et al. | 355/53 |
| 2006/0279721 A1* | 12/2006 | Baggen et al. | 355/72 |
| 2010/0157276 A1 | 6/2010 | Shibazaki | |

FOREIGN PATENT DOCUMENTS

| | | |
|---|---|---|
| JP | 10261580 A | 9/1998 |
| JP | 11212266 A | 8/1999 |
| JP | 2001332490 | 11/2001 |
| JP | 2003263227 A | 9/2003 |
| JP | 2004311904 A | 11/2004 |
| JP | 2007318107 A | 12/2007 |
| JP | 2011003875 A | 1/2011 |
| WO | 01/45145 | 6/2001 |

* cited by examiner

MOVABLE SUPPORT, POSITION CONTROL SYSTEM, LITHOGRAPHIC APPARATUS AND METHOD OF CONTROLLING A POSITION OF AN EXCHANGEABLE OBJECT

CROSS REFERENCE TO RELATED APPLICATIONS

This application claims priority and benefit under 35 U.S.C. §19(e) to U.S. Provisional Patent Application No. 61/064,051, entitled "Movable Support, Position Control System, Lithographic Apparatus and Method of Controlling a Position of an Exchangeable object", filed on Feb. 13, 2008. The content of that application is incorporated herein in its entirety by reference

FIELD

The present invention relates to a movable support, a position control system, a lithographic apparatus, and a method of controlling a position of an exchangeable object.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus, use is made of a movable support to hold and position an exchangeable object such as the substrate or the patterning device. In a scanning type lithographic apparatus, a movable support is used to support the substrate in order to make the scanning movement. The patterning device may also be supported on a movable support. The movable support is able to position the substrate or patterning device with high accuracy.

To obtain a high accuracy, a known movable support is assembled from a long stroke part, movable with respect to a reference object such as a frame or balance mass, and a short stroke part, movably arranged with respect to the long stroke part. The short stroke part is configured to support the exchangeable object. The maximum stroke of the long stroke part with respect to reference object is relatively large, while the stroke of the short stroke part with respect to the long stroke part is relatively small.

A long stroke actuator is provided to actuate the long stroke part with respect to the reference object. A short stroke actuator is provided to actuate the short stroke part with respect to the long stroke part. Such long stroke actuator is for instance a linear motor, and may not be very accurate. The main task of the long stroke actuator is to bring a desired position of the exchangeable object within the reach of the short stroke actuator. The short stroke actuator is designed to position the short stroke part with high accuracy.

In order to control the position of the exchangeable object, the position of the second support system is determined by a position measurement system, for instance an interferometer system or an encoder system. This measurement is for instance performed in three planar degrees of freedom or in six degrees of freedom. The measured position is compared with a desired position. The position error, i.e. the difference between measured and desired position is fed into a controller which on the basis of this signal provides a control signal which is used to actuate the short stroke actuator.

The long stroke actuator is controlled by using a signal based on the difference between the actual position of the short stroke part and the long stroke part as an input signal for the long stroke actuator controller. The output of this controller makes the long stroke part follow the movements of the short stroke part, therewith keeping the desired position of the short stroke part within the range of the short stroke actuator.

The short stroke actuator may be of the Lorentz type to enable isolation from long-stroke vibrations. Such Lorentz type actuator has a small stiffness. Any other type of actuator having a small stiffness and high accuracy may also be used to accurately control the position of the exchangeable object support by the movable support. The input of a Lorentz actuator is an electrical current, substantially proportional to the desired force. Generally, the movable support position response to an input force is somewhat delayed because the force is integrated twice before it turns into a position. This effect, together with higher-order dynamics, limits the bandwidth of the short-stroke control loop. This limited bandwidth has a negative effect on the accuracy/settling time in the positioning of the exchangeable object held on the movable support.

The force-type-actuator in the stages may also limit the achievable feed-forward effect from one stage to the other (e.g. substrate table error fed to patterning device support). In this feed-forward, the position error of one stage needs to be differentiated twice to generate a feed-forward force, which costs one sample delay. This leads to a delayed response of the other stage, limiting positioning accuracy of the stages relative to each other.

SUMMARY

It is desirable to increase the accuracy and/or settling time of positioning of an exchangeable object such as a substrate or patterning device, supported by a movable support.

According to an embodiment of the invention, there is provided a movable support configured to hold an exchangeable object, the support including a movable structure movably arranged with respect to a reference object, an object holder movably arranged with respect to the movable structure and configured to hold the exchangeable object, an actuator configured to move the movable structure with respect to the reference object, and an ultra short stroke actuator configured to move the object holder with respect to the movable structure, wherein a stiffness of the ultra short stroke actuator is substantially larger than a stiffness of the at least one actuator.

According to an embodiment of the invention there is provided a position control system for controlling the position of an exchangeable object held on a movable support, including a position measurement system configured to measure a position of the movable structure, a comparator configured to provide an error signal by comparing the measured position with a desired position, a controller configured to provide a control signal to the actuator based on the error signal, and an ultra short stroke controller configured to provide a control signal to the ultra short stroke actuator based on the error signal.

According to an embodiment of the invention there is provided a lithographic apparatus including an illumination system configured to condition a radiation beam; a patterning device support constructed to support a patterning device, the patterning device being capable of imparting the radiation beam with a pattern in its cross-section to form a patterned radiation beam; a substrate support constructed to hold a substrate; and a projection system configured to project the patterned radiation beam onto a target portion of the substrate, wherein the patterning device support and/or the substrate support is a movable support including a movable structure movably arranged with respect to a reference object, an object holder movably arranged with respect to the movable structure and configured to hold the respective patterning device or substrate, an actuator configured to move the movable structure with respect to the reference object, and an ultra short stroke actuator configured to move the object holder with respect to the movable structure, wherein a stiffness of the ultra short stroke actuator is substantially larger than a stiffness of the at least one actuator.

According to an embodiment of the invention there is provided a method of controlling a position of an exchangeable object held by a movable support, the support including a movable structure movably arranged with respect to a reference object, an object holder movably arranged with respect to the movable structure and configured to hold the exchangeable object, an actuator configured to move the movable structure with respect to the reference object, and an ultra short stroke actuator configured to move the object holder with respect to the movable structure, a stiffness of the ultra short stroke actuator is substantially larger than a stiffness of the at least one actuator, the method including measuring a position of the movable structure, providing an error signal by comparing the measured position with a desired position, providing a control signal to the actuator based on the error signal, and providing a control signal to the ultra short stroke actuator based on the error signal.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
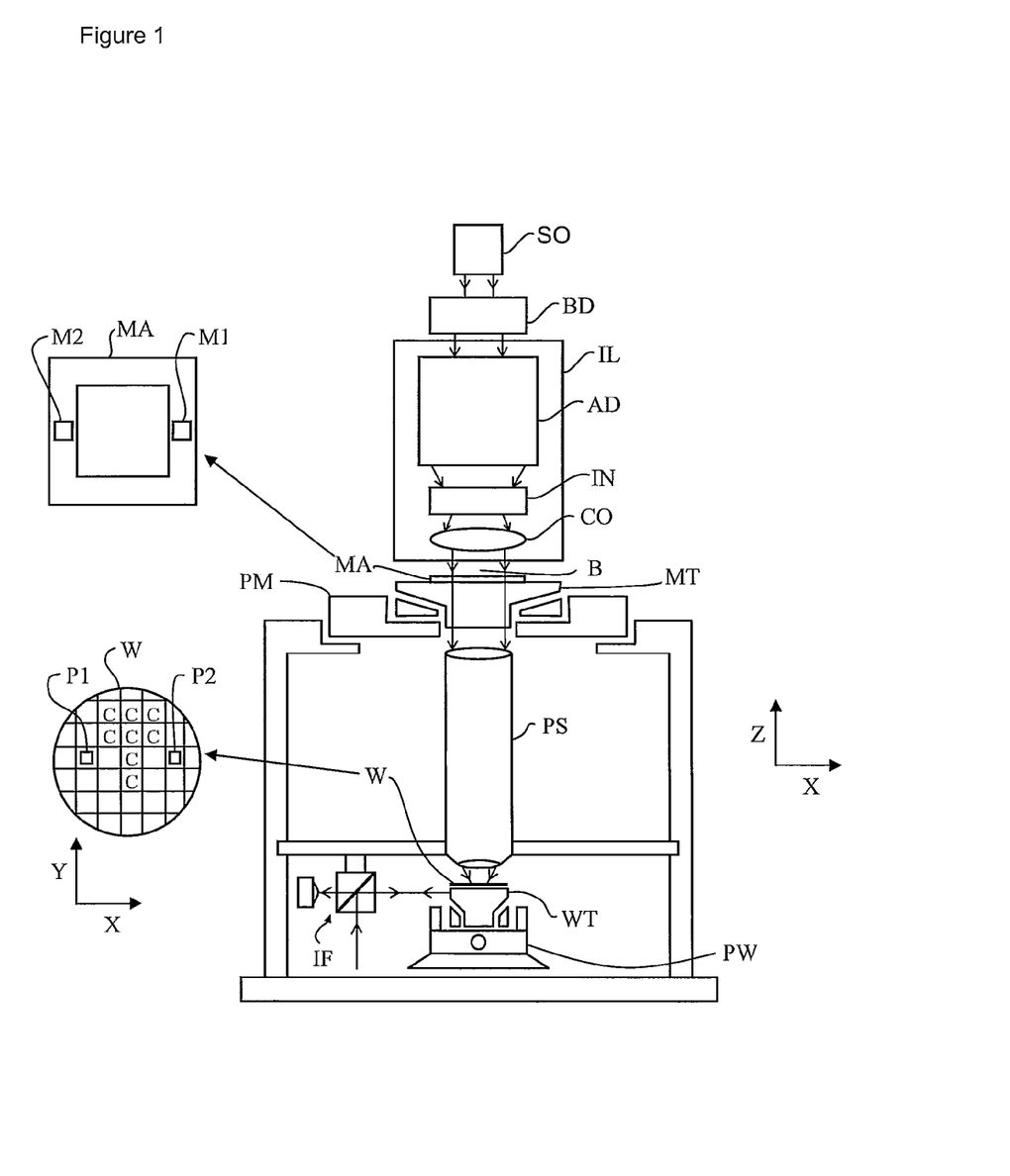
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
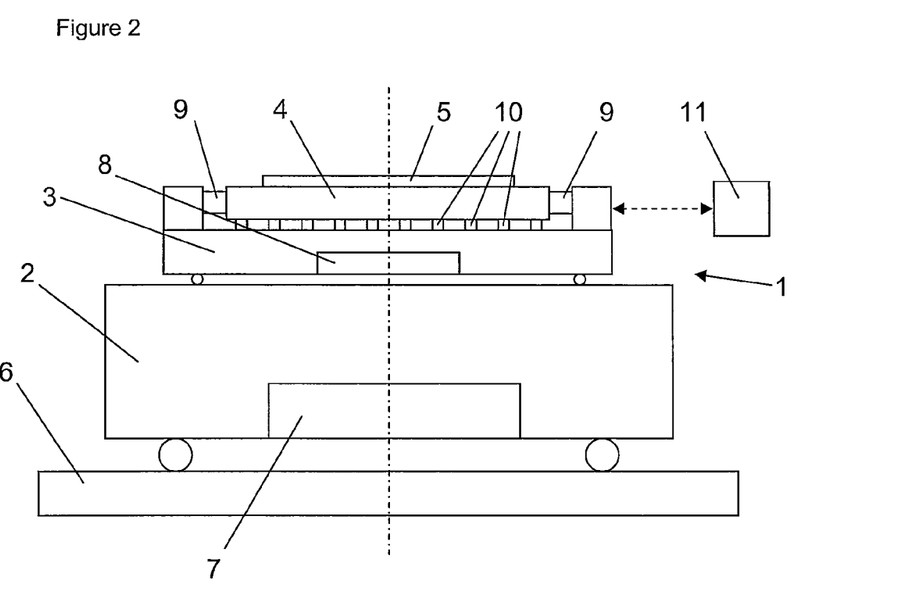
FIG. 2 depicts a schematic side view of a movable support according to an embodiment of the invention.

FIG. 2 shows a side view of a substrate stage according to an embodiment the invention. The substrate stage generally denoted by reference numeral 1 includes a long stroke part 2. The long stroke part supports a short stroke part 3, and the short stroke part supports a object holding structure or object holder 4. The object holding structure or object holder 4 (e.g. the substrate table) supports an exchangeable object, e.g. substrate 5.

The long stroke part 2 is movably mounted with respect to a reference object 6, for instance a frame or a balance mass. A long stroke actuator 7 is provided to move the long stroke part 2 with respect to the reference object 6. A short stroke actuator 8 is provided to move the short stroke part 3 with respect to the long stroke part 2. The short stroke actuator 8 has a relative high accuracy in positioning of the short stroke part 3 with respect to the long stroke part 2, but has a limited working range. The long stroke actuator 7 has a large working range, typically the whole working space of the substrate stage 1 and a relative low accuracy. The main task of the long stroke actuator 8 is to bring the desired position of the substrate stage 1 within the range of the short stroke actuator 8 so that the short stroke actuator 8 may position the substrate with high accuracy.

A position measurement system 11 has been provided to measure the position of the short stroke part 3. The position measurement system may be any system which is capable of measuring the position of the short stroke part 3 with high accuracy, such as an interferometer system or an encoder measurement system.

In order to isolate the short stroke part 3 from vibrations of the long stroke part 2 or the reference object, the short stroke actuator 8 is of a type having a low stiffness. Such actuator is for instance a Lorentz motor. The input of this type of actuator is an electrical current, proportional to the desired force. The position response to an input force is somewhat delayed because the force is integrated twice before it turns into a position. This effect, together with higher-order dynamics, limits the bandwidth of the short-stroke control loop, which in turn limits the achievable stage positioning accuracy.

It is further remarked that the force-type short stroke actuator 8 also limits the achievable feed-forward effect from substrate stage to the patterning device stage or vice versa. In this feed-forward, the position error of one stage is differentiated twice to create a feed-forward force, which costs one sample delay. This leads to a delayed response of the other stage, limiting positioning accuracy of the stages relative to each other.

Furthermore, due to the low stiffness of the short stroke actuator 8, during acceleration of the stage the full force desired for acceleration of the second and object holding structure or object holder has to be exerted by the short stroke actuator 8. At the same time the short stroke actuator has to be capable of exerting small forces with high accuracy to make precise positioning of the short stroke part 3. This makes the demand on the short stroke actuator 8, and the driving electronics like the amplifier, even higher.

With increasing demands on imaging accuracy and throughput, it is desirable to further increase the accuracy and decrease the settling time in the positioning of exchangeable objects such as substrates or patterning devices.

According to an embodiment of the present invention, an ultra short stroke actuator 9 has been provided to cause movements between the short stroke part 3 and the object holding structure or object holder 4. The object holding structure or object holder 4 is a table which rests on a number of burls 10, provided on the short stroke part 3. The table is held on the short stroke part 3 by a vacuum force which is created in the space between the burls 10. At the side of the table, between the short stroke part 3 and the object holding structure or object holder 4 a number of ultra short stroke actuators 9 are arranged. These ultra stroke actuators 9 have a relative high stiffness and are for instance piezo-elements which lengthen or shorten when actuated. The resulting force on the table may result in a small elastic deformation of the burls, therewith creating a movement between the short stroke part 3 and the object holding structure or object holder 4. This deformation is typically smaller than about ±100 nm, for instance ±10 nm or less.

The ultra short stroke actuator 9 may have a high stiffness as the isolation of errors is already performed by the short stroke actuator 8 and possibly the long stroke actuator 7. Preferably, the actuator is a position type actuator, i.e. it directly responds in terms of position. An example of such position type actuator is a piezo-element which gives a deformation as a direct result of an electric voltage.

The ultra short stroke actuator 9 can be used to correct the error of the short stroke actuator 8. This error may for instance be the servo error caused by the lagged response of the force-type short stroke actuator 8, as now will be explained.

Figure 3:
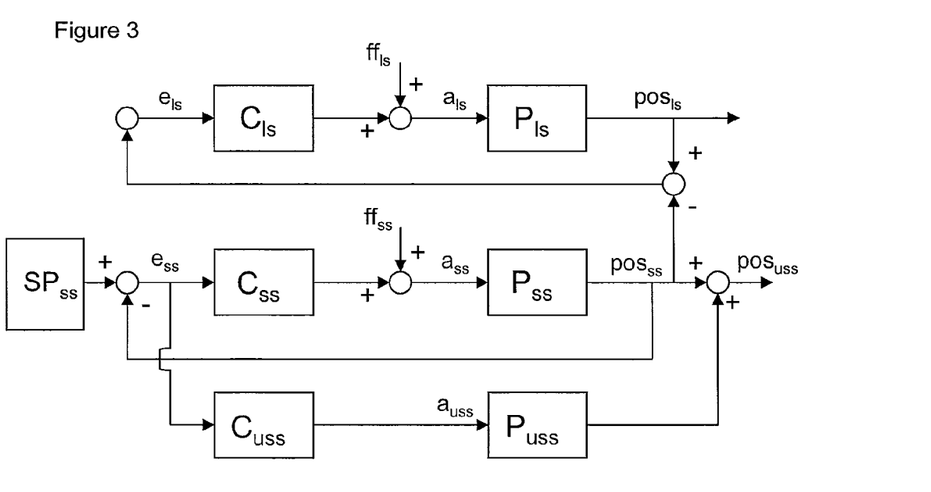
FIG. 3 depicts a control scheme for the movable support of FIG. 2 in accordance with an embodiment of the invention.

FIG. 3 shows a control scheme for the stage 1 of FIG. 2. The control scheme is configured to position the substrate supported by the stage 1 with high accuracy. The position measurement system 11 measures a position $pos_{ss}$ of the short stroke part with high accuracy. A set point generator SPss generates a set-point signal for the short stroke control loop representative of the desired position. A comparator subtracts the measured position $pos_{ss}$ from the desired position resulting in an error signal $e_{ss}$, i.e. the difference between desired and measured position. This error signal $e_{ss}$ is fed to a short stroke controller $C_{ss}$ which provides on the basis of the error signal $e_{ss}$ a control signal $a_{ss}$ to the short stroke actuator 8, which is part of the mechanics of the short stroke control loop indicated in FIG. 3 with $P_{ss}$. Due to actuation of the short stroke actuator 8, the substrate is moved with high accuracy towards the desired position. It is remarked that the control signal $a_{ss}$ may includes a feed-forward component $ff_{ss}$ which is added to the controller output.

In order to keep the desired position within the working range of the short stroke actuator 8, the actual position $pos_{ss}$ of the short stroke part is compared with the actual position of the first substrate support $pos_{ls}$. This relative position of the short stroke part with respect to the first substrate support may directly be measured by a sensor. As an alternative, the position measurement signal of the interferometer system may be used. The difference between the two positions $pos_{ss}$ and $pos_{ls}$ is fed as an error signal $e_{ls}$ of the long stroke control loop to the long stroke controller $C_{ls}$ to provide a control signal $a_{ls}$. This control signal $c_{ls}$ is fed to the long stroke actuator 7 to move the long stroke part 2 such that the desired position of the substrate falls within the working range of the short stroke actuator 8. Also, the control signal $a_{ls}$ of the long stroke control loop may include a feed-forward component $ff_{ss}$ which is added to the controller output.

As discussed above, the reaction time of the short stroke part on a control signal $a_{ss}$ of the short stroke controller $C_{ss}$ may be critical for further increasing the performance of the short stroke controller. Also, other performance limitations of the short stroke actuator 8 and/or the combination of second and object holding structures or object holders 3 and 4 may interfere with further improvement of the accuracy of the positioning of the exchangeable object supported by the object holding structure or object holder 4. Examples of these effects are amplifier noise and parasitic stiffness of electrical and other connections between support structures 3 and 4.

For this reason, the ultra short stroke actuator 9 is provided. The ultra stroke actuator 9, part of the ultra short stroke mechanics $P_{uss}$ as depicted in FIG. 3, is driven by a control signal $a_{uss}$ provided by an ultra short stroke controller $C_{uss}$. The input signal for the ultra short stoke controller $C_{uss}$ is the error signal $e_{ss}$, i.e. the difference between desired position of the short stroke part 3 as given by the setpoint generator $SP_{ss}$ and the measured position $pos_{ss}$. By feeding the error signal $e_{ss}$ to the ultra stroke controller $C_{uss}$, a control signal $a_{uss}$ can be provided which actuates the ultra short stroke actuator 9 to move the object holding structure or object holder 4 with respect to short stroke part 3 over a distance substantially corresponding to the position error of the short stroke part 3, therewith substantially reducing the actual error of the exchangeable object 5. Since the ultra short stroke actuator 9 is a position-type actuator, i.e. an actuator which directly responds in a position change on an input signal, the error resulting from the reaction time of the force-type short stroke actuator 8 may be substantially compensated.

Thus, more generally the ultra short stroke control loop is used to compensate for the error of the short stroke control loop.

The ultra short stroke controller $C_{uss}$ may only include a gain $K_{uss}$. This gain is calibrated with respect to the internal dynamic behavior of the stage 1, in particular the flexibility of the object holding structure or object holder 4 with respect to the short stroke part 3. In this respect it is remarked, that in conventional lithographic apparatus it is desired to make the connection between the short stroke part 3 and object holding structure or object holder 4 as stiff as possible in order to avoid any position errors due to this flexibility. In an embodiment of the present invention, it is desired to have some flexibility in order to make error compensation by an ultra short stroke control loop possible.

In the embodiment shown in FIG. 2, the flexibility of the object holding structure or object holder 4 with respect to the short stroke part 3 is obtained by the flexibility of the burls 10 supporting the object holding structure or object holder 4. The gain $K_{uss}$ thus gives the relation between the position error of the short stroke part 3 and the force desired to displace the object holding structure or object holder 4 with respect to the short stroke part 3 by elastic deformation of the burls 10 over a distance substantially the same as the position error of the short stroke part 3. The gain $K_{uss}$ can for instance easily be calibrated with an accuracy of 10% or less. Using this gain in the control scheme of FIG. 3 may lead to an at least tenfold accuracy improvement in the positioning accuracy of the exchangeable object 5 supported by the movable support 1.

It is remarked that although the flexibility of the burls 10 is used to compensate the positioning error of the short stroke control loop, the stiffness of the connection between the short stroke part 3 and the object holder 4 still needs to be substantial in order to transfer the acceleration force from the short stroke part 3 to the object holder 4. Correspondingly, the stiffness of the ultra short stroke actuator 9 has to be relatively large to easily accelerate the object holder 4 during acceleration of the short stroke part 3 and to compensate the error. This stiffness of the ultra short stroke controller includes the stiffness of the actuator itself as well as the stiffness of the connection between the short stroke part and the object holder, in the present example the stiffness of the burls 10.

The stiffness is preferably substantially larger than the relative low stiffness of the short stroke actuator. A high stiffness also contributes to the response speed of the actuators 9, as the first eigenfrequency of the support $$4 \text{ equals } \frac{1}{2\pi}\sqrt{\frac{c}{m}},$$

with c the total stiffness of the connection between the supports 3 and 4, and m the mass of the support 4. A higher stiffness hence results in a higher eigenfrequency and hence a faster response. On the other hand, the actuator range decreases as the overall stiffness of the burls increases. Because the actuator range that is needed for the ultra-short-stroke actuator is extremely small, this is adequate.

In an embodiment of the present invention applied in a lithographic apparatus, the maximum error of the short stroke control loop equals a maximum of about ±100 nm, and typically is smaller than about ±10 nm. Thus the working range of the ultra short stroke controller is correspondingly small. In the case of piezo elements, which provide typically a maximum change in dimension of one tenth percent of its dimension, the piezo-element may have dimensions in the range of about 1-10 mm or even smaller. Such piezo-elements can easily be integrated in a existing lithographic apparatus concept.

The gain $K_{uss}$ of the ultra short stroke controller may be made position dependent on a particular position of the movable support, for instance the position of the short stroke part or substrate 5 with respect to the projection system. As the movement of the object holder with respect to the short stroke part will be relatively small, the position of the substrate 5 will generally correspond with the position of the short stroke part. Such position dependent gain may for instance be used for compensation of position dependent overlay effects.

Figure 4:
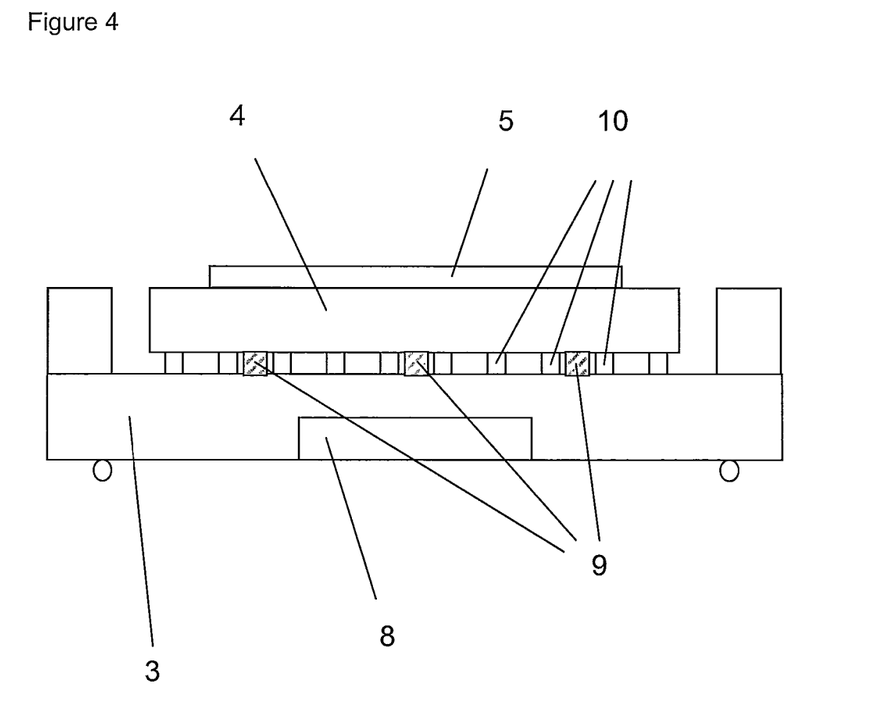
FIG. 4 depicts a movable support according to an embodiment of the invention.

In addition or as an alternative it is possible to use the ultra short stroke actuator to compensate for deformations within the object holder which deformations are for instance caused by temperature differences FIG. 4 shows an alternative embodiment of the ultra short stroke actuators 9. In FIG. 4 only the short stroke part 3 and the object holder 4 are shown. In this embodiment shear piezo elements 9 are used as ultra short stroke actuators. Such shear piezo-elements will change in shape when a current is applied typically from a rectangular basic form to a parallelogram form. Such piezo-element which is relative stiff is a position type actuator as it directly changes shape in reaction on a voltage. Thus position of the object holder 4 with respect to the short stroke part 3 changes directly upon actuation of the ultra short stroke actuator 9.

In alternative embodiments, other actuators having a relative large stiffness and which are preferably position-type actuators may be used. An example of such an actuator is a Lorentz actuator in parallel with a relative stiff spring. Such a combination also functions as a position actuator: a current through the coils of the actuator results in a fast position change of the spring.

Figure 5:
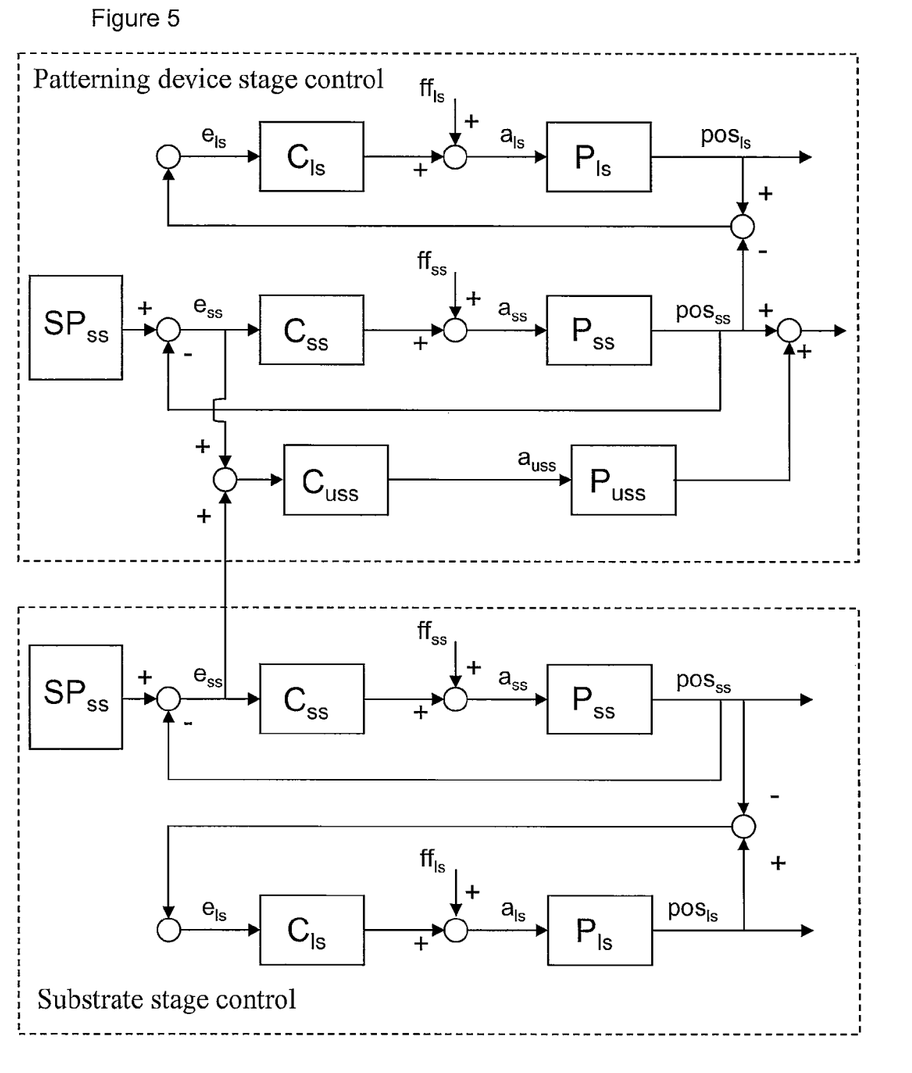
FIG. 5 depicts a control scheme of a substrate stage and a patterning device stage according to an embodiment of the invention.

FIG. 5 shows a position control scheme for a patterning device stage and substrate stage combination of a lithographic apparatus. It will be appreciated that during projection of an image, the patterning device stage which carries the patterning device and the substrate stage which carries the substrate on which the image of the patterning device is projected are perfectly aligned to avoid imaging errors.

In the control scheme of FIG. 5, the patterning device stage and the substrate stage both include a short stroke part movably arranged with respect to a long stroke part. The position control of the short stroke part and long stroke part of each of the patterning device stage and substrate stage is controlled with a short stroke and long stroke control loop as explained with reference to FIG. 3.

The patterning device stage includes an ultra short stroke actuator having a relative high stiffness, for instance a number of piezo-elements. The ultra short stroke actuator is driven by a ultra short stroke controller $C_{uss}$. The input of the ultra short stroke controller $C_{uss}$ is the position error of the patterning device stage plus the position error of the substrate stage. By taking into account the position error of the patterning device stage and position error of the substrate stage, the patterning device and substrate are optimally aligned with respect to each other It is noted that the terms long stroke, short stroke, and ultra short stroke are used herein to indicate a relative difference between these terms. Generally, the term long stroke relates to the complete working range of the movable support. The short stroke range corresponds to the range of the short stroke actuator. The term ultra short stroke generally corresponds to the error range of the control loop of the short stroke actuator.

In the above described embodiment of a movable support a long stroke actuator was described to move a long stroke part of a movable support within the range of a short stroke actuator. In case such long stroke actuator is not required, i.e. the working range of the movable support corresponds or is smaller than the working range of the short stroke actuator, the long stroke part and the long stroke actuator may be omitted.

Hereinabove position measurement and control was described. In a practical implementation it may also be possible that position dependent signals are used to determine or control the position of a movable support. Therefore, within the scope of the present application the term position also includes position dependent signals, such as speed or acceleration used for determination or control of the position, or a position dependent variable of the movable support.

Furthermore, the ultra-short stroke controller as described above only has an input related to the position error of the support 3. No position measurement of support 4 was described. However, to ensure an even higher accuracy, position sensors could be added that measure the position of support 4 with respect to the support 3, or with respect to an external reference. This extra position measurement could be input to the ultra-short stroke controller to further reduce the errors of support 4.

Also, the determination and control of the position of the movable support was described in one degree of freedom. In practice, the position will be often controlled in two or more degrees of freedom. Typically, the stages of a lithographic apparatus are controlled in three coplanar degrees of freedom or six degrees of freedom.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A movable support configured to hold an exchangeable object, the support comprising:
    a movable structure movably arranged with respect to a reference object;
    an object holder arranged over, and movable with respect to, the movable structure, the object holder including an upper surface to receive a lower surface of the exchangeable object and configured to hold and bear a weight of the exchangeable object from the lower surface of the exchangeable object, the object holder being supported by the movable structure;
    an actuator configured to move the movable structure with respect to the reference object; and
    an ultra short stroke actuator configured to move the object holder with respect to the movable structure,
    wherein a stiffness of the ultra short stroke actuator is substantially larger than a stiffness of the actuator, and
    wherein the ultra short stroke actuator is configured to move the object holder with respect to the movable structure to compensate for an error between a measured position of the movable structure and a desired position of the movable structure.

2. The movable support of claim 1, wherein the ultra short stroke actuator is a position actuator.

3. The movable support of claim 1, wherein the ultra short stroke actuator comprises a piezo actuator.

4. The movable support of claim 1, wherein the movable structure comprises a long stroke part and a short stroke part, wherein the long stroke part and short stroke part are movably arranged with respect to each other, wherein the short stroke part is configured to hold the object holder, and wherein the actuator is a short stroke actuator configured to move the short stroke part with respect to the long stroke part, the movable support further comprising a long stroke actuator configured to move the long stroke part with respect to the reference object.

5. The movable support of claim 4, wherein the short stroke actuator comprises a Lorentz actuator.

6. The movable support of claim 4, wherein the long stroke part is a stage, the short stroke part is a chuck and the object holder is an exchangeable object table.

7. The movable support of claim 4, wherein the ultra short stroke actuator is configured to move the object holder with respect to the movable structure to compensate for an error between a measured position of the short stroke actuator and a desired position of the short stroke actuator.

8. The movable support of claim 1, wherein the movable structure comprises a clamping device configured to hold the object holder.

9. The movable support of claim 8, wherein the clamping device is a vacuum clamp, or an electrostatic clamp, or both a vacuum clamp and an electrostatic clamp.

10. The movable support of claim 8, wherein the clamping device comprises a plurality of burls on which the object holder is clamped, the burls providing flexibility between the movable structure and the object holder.

11. The movable support of claim 1, wherein the movable structure comprises a long stroke part and a short stroke part, wherein the long stroke part and short stroke part are movably arranged with respect to each other, wherein the short stroke part is configured to hold the object holder, and wherein the actuator is a short stroke actuator configured to move the short stroke part with respect to the long stroke part, the movable support further comprising a long stroke actuator configured to move the long stroke part with respect to the reference object and wherein the ultra short stroke actuator is configured to move the object holder with respect to the short stroke part to compensate for the error between a measured position of the short stroke part and a desired position of the short stroke part.

12. A position control system for controlling a position of an exchangeable object held on a movable support, the movable support comprising a movable structure movably arranged with respect to a reference object, an object holder arranged over, and movable with respect to, the movable structure, the object holder including an upper surface to receive a lower surface of the exchangeable object and configured to hold and bear a weight of the exchangeable object from the lower surface of the exchangeable object, the object holder being supported by the movable structure, an actuator configured to move the movable structure with respect to the reference object, and an ultra short stroke actuator configured to move the object holder with respect to the movable structure, a stiffness of the ultra short stroke actuator being substantially larger than a stiffness of the actuator, the position control system comprising:
 a position measurement system configured to measure a position of the movable structure;
 a comparator configured to provide an error signal by comparing the measured position with a desired position of the movable structure;
 a controller configured to provide a control signal to the actuator based on the error signal; and
 an ultra short stroke controller configured to provide a control signal to the ultra short stroke actuator based on the error signal,
 wherein the ultra short stroke actuator is configured to move the object holder with respect to the movable structure to compensate for a positioning error representative of the error signal between the measured position of the movable structure and the desired position of the movable structure.

13. The position control system of claim 12, wherein the ultra short stroke controller is a feed-forward controller.

14. The position control system of claim 13, wherein the ultra short stroke controller comprises a calibrated gain.

15. The position control system of claim 14, wherein the gain is dependent on the position of the movable structure.

16. The position control system of claim 12, comprising a second position measurement system configured to measure the position of the object holder with respect to the movable structure, the measured position of the object holder being fed to the controller, or the ultra short stroke controller, or both the controller and the ultra short stroke controller.

17. The position control system of claim 12, wherein the movable structure comprises a long stroke part and a short stroke part, wherein the long stroke part and short stroke part are movably arranged with respect to each other, wherein the short stroke part is configured to hold the object holder, wherein the position measurement system is configured to measure a position of the short stroke part, and wherein the actuator is a short stroke actuator configured to move the short stroke part with respect to the long stroke part, the movable support further comprising a long stroke actuator configured to move the long stroke part with respect to the reference object.

18. The position control system of claim 12, wherein the movable structure comprises a long stroke part and a short stroke part, wherein the long stroke part and short stroke part are movably arranged with respect to each other, wherein the short stroke part is configured to hold the object holder, wherein the position measurement system is configured to measure a position of the short stroke part, and wherein the actuator is a short stroke actuator configured to move the short stroke part with respect to the long stroke part, the movable support further comprising a long stroke actuator configured to move the long stroke part with respect to the reference object and wherein the ultra short stroke actuator is configured to move the object holder with respect to the short stroke part to compensate for the error between a measured position of the short stroke part and a desired position of the short stroke part.

19. A lithographic apparatus comprising:
 a patterning device support constructed to support a patterning device, the patterning device being capable of imparting a radiation beam with a pattern in a cross-section of the radiation beam to form a patterned radiation beam;
 a substrate support constructed to hold a substrate; and
 a projection system configured to project the patterned radiation beam onto a target portion of the substrate,
 wherein at least one of the supports comprises
  a movable structure movably arranged with respect to a reference object;
  an object holder arranged over, and movable with respect to, the movable structure, the object holder including an upper surface to receive a lower surface of the respective substrate or patterning device and configured to hold and bear a weight of the respective substrate or patterning device from the lower surface of the respective substrate or patterning device, the object holder being supported by the movable structure;
  an actuator configured to move the movable structure with respect to the reference object; and
  an ultra short stroke actuator configured to move the object holder with respect to the movable structure, wherein a stiffness of the ultra short stroke actuator is substantially larger than a stiffness of the actuator, and wherein the ultra short stroke actuator is configured to move the object holder with respect to the movable structure to compensate for an error between a measured position of the movable structure and a desired position of the movable structure.

20. The lithographic apparatus of claim 19, wherein the reference object is a balance mass or a frame.

21. The lithographic apparatus of claim 19, comprising a position control system comprising
a position measurement system configured to measure a position of the movable structure;
a comparator configured to provide an error signal by comparing the measured position with a desired position of the movable structure;
a controller configured to provide a control signal to the actuator based on the error signal; and
an ultra short stroke controller configured to provide a control signal to the ultra short stroke actuator based on the error signal.

22. The lithographic apparatus of claim 21, wherein the control signal of the ultra short stroke actuator is based on the error signal and a second error signal, the second error signal being the difference between actual position and desired position of the other of the patterning device support and the substrate support.

23. The lithographic apparatus of claim 19, wherein the movable structure comprises a long stroke part and a short stroke part, wherein the long stroke part and short stroke part are movably arranged with respect to each other, wherein the short stroke part is configured to hold the object holder, and wherein the actuator is a short stroke actuator configured to move the short stroke part with respect to the long stroke part, the movable support further comprising a long stroke actuator configured to move the long stroke part with respect to the reference object and wherein the ultra short stroke actuator is configured to move the object holder with respect to the short stroke part to compensate for the error between a measured position of the short stroke part and a desired position of the short stroke part.

24. A method of controlling a position of an exchangeable object held by a movable support, the support comprising a movable structure movably arranged with respect to a reference object, an object holder arranged over, and movable with respect to, the movable structure, the object holder including an upper surface to receive a lower surface of the exchangeable object and configured to hold and bear a weight of the exchangeable object from the lower surface of the exchangeable object, the object holder being supported by the movable structure, an actuator configured to move the movable structure with respect to the reference object, and an ultra short stroke actuator configured to move the object holder with respect to the movable structure, a stiffness of the ultra short stroke actuator being substantially larger than a stiffness of the at least one actuator, the method comprising:
measuring a position of the movable structure,
providing an error signal by comparing the measured position with a desired position,
providing a control signal to the actuator based on the error signal, and
providing a control signal to the ultra short stroke actuator based on the error signal to compensate for a positioning error representative of the error signal between the measured position of the movable structure and the desired position of the movable structure.

25. The method of claim 24, wherein providing a control signal to the ultra short stroke actuator comprises feed forwarding the error signal multiplied by a gain.

26. The method of claim 25, wherein the gain is obtained by calibration.

27. The method of claim 24, wherein the control signal provided to the ultra short stroke actuator is dependent on the position of the movable support.

28. The method of claim 24, wherein the control signal provided to the ultra short stroke actuator is dependent on internal deformations in the object holder.

29. The method of claim 24, comprising:
measuring a position of the object holder;
providing an object holder error signal by comparing the measured position with a desired position; and
providing a control signal to the actuator based on the object holder error signal, or providing a control signal to the ultra short stroke actuator based on the object holder error signal, or both.

30. The method of claim 24, wherein the movable structure comprises a long stroke part and a short stroke part, wherein the long stroke part and short stroke part are movably arranged with respect to each other, wherein the short stroke part is configured to hold the object holder, and wherein the actuator is a short stroke actuator configured to move the short stroke part with respect to the long stroke part, the movable support further comprising a long stroke actuator configured to move the long stroke part with respect to the reference object and wherein the ultra short stroke actuator is configured to move the object holder with respect to the short stroke part to compensate for the error between a measured position of the short stroke part and a desired position of the short stroke part.

* * * * *